United States Patent [19]
Yajima et al.

[11] Patent Number: 4,887,037
[45] Date of Patent: Dec. 12, 1989

[54] ELECTRON SPIN RESONANCE SPECTROMETER

[75] Inventors: Yusuke Yajima, Kokubunji; Kanji Tsujii, Tokyo, both of Japan

[73] Assignee: Hitachi, Ltd., Tokyo, Japan

[21] Appl. No.: 153,092

[22] Filed: Feb. 8, 1988

[30] Foreign Application Priority Data

Mar. 20, 1987 [JP] Japan .................................. 62-63776

[51] Int. Cl.$^4$ ............................................. G01R 33/20
[52] U.S. Cl. .................................................. 324/316
[58] Field of Search ....................... 324/300, 316, 58.5; 333/219

[56] References Cited

U.S. PATENT DOCUMENTS

| | | | |
|---|---|---|---|
| 2,743,322 | 4/1956 | Pierce | 324/316 |
| 3,287,659 | 11/1966 | Aucker | 324/316 |
| 3,293,567 | 12/1966 | Komatsubara | 324/316 |
| 3,878,454 | 4/1975 | Hyde | 324/316 |

FOREIGN PATENT DOCUMENTS 58-24843  2/1983  Japan .

Primary Examiner—Michael J. Tokar
Attorney, Agent, or Firm—Antonelli, Terry & Wands

[57] ABSTRACT

An electron spin resonance spectrometer is disclosed, in which a sample made of a semiconductor material or the like is illuminated with light while being applied with a magnetic field and a microwave, to detect the electron spin resonance due to a defect in a light-illuminated portion of the sample, on the basis of a photo-induced voltage appearing across the sample or a reduction in microwave intensity caused by the microwave absorption of the sample.

19 Claims, 4 Drawing Sheets

ELECTRON SPIN RESONANCE SPECTROMETER

BACKGROUND OF THE INVENTION

The present invention relates to an electron spin resonance spectrometer (hereinafter referred to as ESR spectrometer) suitable for measurements in a localized area, and more particularly to an ESR spectrometer suitable for non-destructive measurements of the two-dimensional distribution of specified defects in films related to semiconductor electronics or in semiconductor wafers.

FIG. 8 shows the general construction of a conventional ESR spectrometer. Referring to FIG. 8, a resonant cavity 1 is disposed between a pair of magnetic poles 19 of an electromagnet, and is connected to a microwave generator/detector 16, which makes up a spectrometer 17 together with a recorder 15. A current supplied to the electromagnet is controlled by a magnetic field controller 18. The microwave generator/detector 16 can supply the resonant cavity 1 with microwave, and detect a difference in intensity between the microwave introduced into the resonant cavity 1 and the microwave sent back therefrom. Thus, a reduction in microwave intensity due to the absorption in the resonant cavity, is recorded by the recorder 15 as a function of an applied magnetic field. When magnetic scanning is carried out in a state that a sample 5 is placed within the resonant cavity 1, and a change in microwave intensity due to the microwave absorption of the sample 5 is recorded, an ESR spectrum as shown in FIG. 9 is obtained. A resonance magnetic field (namely, a magnetic field, at which a reduction in microwave intensity due to absorption is maximum) varies with the kind of a defect in the sample 5. Hence, the kind of a defect contained in the sample and the number of defects of this kind can be determined from a resonance magnetic field appearing on an ESR spectrum and a reduction in microwave intensity at this resonance magnetic field. As mentioned above, in the conventional ESR spectrometer, the sample 5 is placed within the resonant cavity 1. Accordingly, the detected signal is an integration of contribution from whole region of samples weighted by the microwave magnetic field strength at each portion. A method of obtaining a detection signal from a specified portion of the sample 5 is disclosed in, for example, a Japanese patent application JP-A No. 58-24843. In this method, the resonant cavity has a through hole at the side wall thereof, and a detection signal is obtained only from that portion of a wafer sample disposed on the outside of the side wall which confronts the through hole. When a mechanism for moving the wafer sample is additionally provided, this method can be used for the two-dimensional distribution measurement of magnetization or mobility in materials for magnetic bubble memory.

In the above method, however, the positional resolution in the two-dimensional distribution measurement is determined by the diameter of the through hole. In a case where the microwave has a frequency in the region of X-band, for example, a frequency of 9.5 GHz, the through hole has a diameter of 5 to 10 mm. When the diameter of the through hole is made smaller than the above, the microwave which can reach the sample on the outside of the resonant cavity through the through hole, becomes very weak, and thus the practical detection sensitivity cannot be obtained. Accordingly, the positional resolution in the above method is set to several milimeters, and hence it is impossible to characterize a localized area of an LSI circuit having a structural unit of one micron.

SUMMARY OF THE INVENTION

An object of the present invention is to provide an ESR spectrometer capable of improving the positional resolution in measurements utilizing electron spin resonance, to the order of one micron.

In order to attain the above object, according to the present invention, there is provided an ESR spectrometer, in which a sample is illuminated with a focused light beam, and a change in carrier recombination speed at a light-illuminated sample portion is detected in the form of a change in photo-induced voltage or a reduction in microwave intensity due to the microwave absorption of the light-illuminated sample portion.

The diameter of the light beam can be basically reduced to 1 $\mu$m or less. In a case where the sample is made of a semiconductor material, carriers are generated at the light-illuminated portion of the sample by the inter-band transition. The carriers thus generated recombine at defects in the light-illuminated sample portion, and the probability of recombination depends on the spin state of carrier. Thus, the ESR absorption due to a specified defect can be detected as a change in photo-induced voltage. When the light beam is scanned with respect to the sample, the two-dimensional distribution of the specified defect in the sample can be estimated with a resolution in the order of one micron. Further, when the defect is illuminated with the light beam, an ESR signal from the defect is varied in intensity. This is because when the defect is illuminated with the light beam, an efficiency, at which the microwave energy absorbed by the defect is released as heat in the sample, is changed. Generally speaking, the above efficiency is increased by illuminating the defect with the light beam. When the efficiency is increased, the defect releases the absorbed microwave energy rapidly as thermal energy, and can again absorb microwave energy. Thus, the amount of microwave energy absorbed by the defect is far larger in the illumination period than in a non-illumination period. The above increase in the amount of absorbed microwave at one defect is constant, and hence the number of defects contained in the light-illuminated portion of the sample can be determined from the measured change in the amount of absorbed microwave. When an applied magnetic field is set to a resonance magnetic field with respect to a defect to be detected, and the surface of the sample is scanned with a light beam to detect a change in the level of ESR signal caused by the movement of the light beam, the two-dimensional distribution of a defect which generates the ESR signal, in the sample can be detected with a resolution in the order of one micron.

DESCRIPTION OF THE PREFERRED EMBODIMENTS

Figure 1:
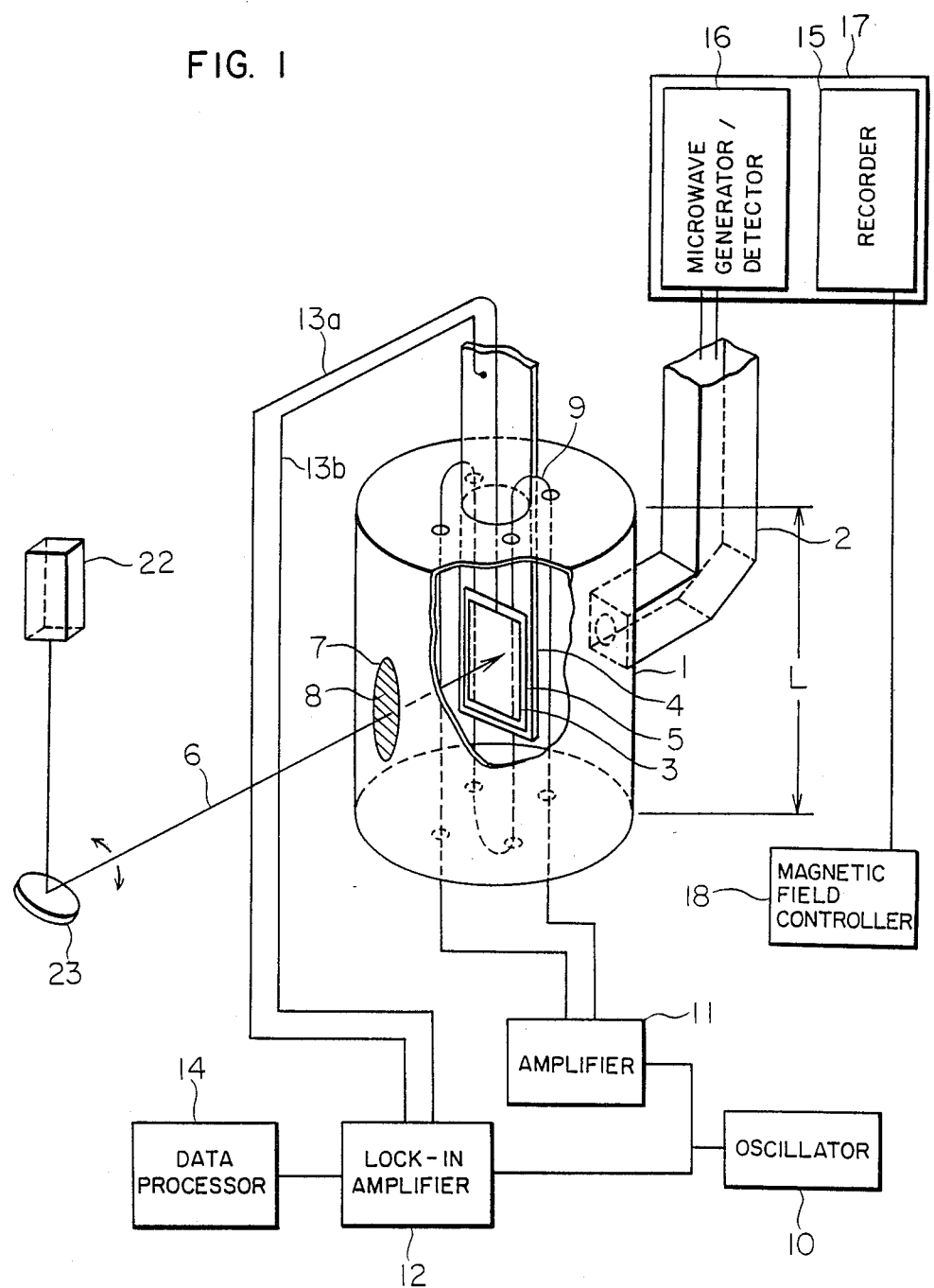
FIG. 1 is a pictorial and block diagram showing a main part of an embodiment of an ESR spectrometer according to the present invention and showing various circuits connected to the main part.
Figure 8:
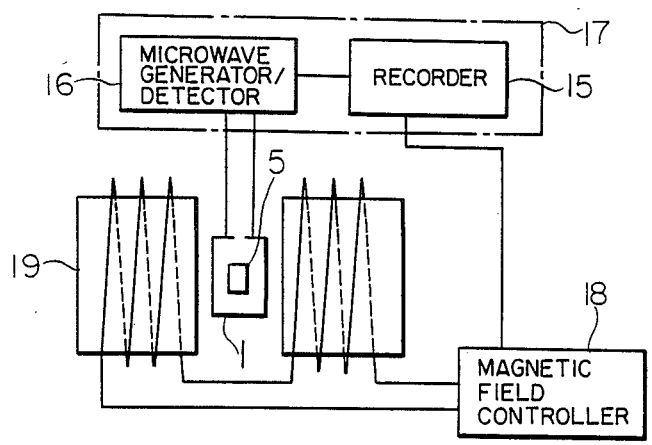
FIG. 8 is a schematic and block diagram showing a conventional ESR spectrometer.
Figure 9:
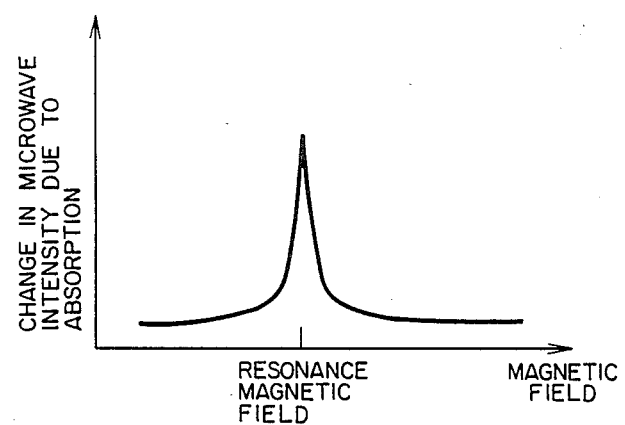
FIG. 9 shows an example of the ESR spectrum obtained by the ESR spectrometer of FIG. 8.

Now, explanation will be made of an embodiment of an ESR spectrometer according to the present invention, with reference to FIG. 1 which shows a main part of the present embodiment and various circuits connected to the main part. Referring to FIG. 1, a resonant caivty 1 is connected to a spectrometer 17 which is made up of a microwave generator/detector 16 and a recorder 15, through a waveguide 2. Further, an optically transparent electrode 3, an electrode/sample-holder 4 and a sample 5 are disposed within the resonant cavity 1 in such a manner that the sample 5 is interdisposed between the electrode 3 and holder 4 and fixed to the holder 4. The side wall of the resonant cavity 1 is provided with a window 7 s that a focused light beam 6 from the outside can impinge on the sample 5 through the optically transparent electrode 3. The focused light beam 6 is emitted from a light source 22 and then deflected by a rotating mirror 23 so that the surface of the sample 3 is scanned with the light beam 6. In order to make the microwave loss at the window 7 negligibly small even when the window 7 has a large area, thin metal wires 8 are provided on the window 7 in directions parallel to the direction of a microwave-induced current flowing in the side wall of the resonant cavity 1, at appropriate intervals. Further, the resonant cavity 1 is provided with a modulation coil 9 for modulating an external magnetic field which is generated by an electromagnet system (not shown) and is applied to the sample 5. The external magnetic field is generated by an electromagnet system corresponding to the magnet 19 of FIG. 8, and can be scanned by a magnetic field controller 18. A modulation signal generated by an oscillator 10 is applied to an input terminal of an amplifier 11 and a reference signal input terminal of a lock-in amplifier 12. The amplifier 11 supplies the modulation coil 9 with a current which has an A.C. component synchronized with the modulation signal, to apply a modulated magnetic field to the sample 5. A lead wire 13a from the optically transparent electrode 3 and another lead wire 13b from the electrode/sample-holder 4 are connected to signal input terminals of the lock-in amplifier 12, the output of which is applied to a data processor 14. In the present embodiment, the sample 5 is disposed within the resonant cavity 1, and the resonant cavity 1 is connected to the spectrometer 17 through the waveguide 2, to make it possible to use the present embodiment as a conventional ESR spectrometer. However, in a case where it is not required to measure the amount of absorbed microwave, but only a photo-induced voltage is measured, the spectrometer 17 may be replaced by a microwave source.

Figure 2:
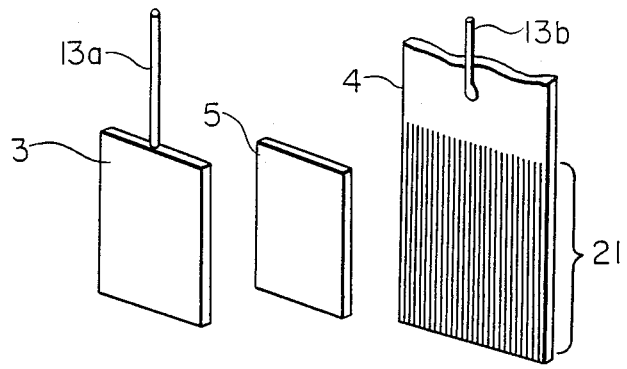
FIG. 2 is an exploded view showing the optically transparent electrode 3, the sample 5 and the electrode/sample-holder 4 of FIG. 1.

Next, explanation will be made of how to set the sample 5, with reference to FIG. 2. In the present embodiment, the optically transparent electrode 3 is made by depositing an indium oxide film on a high purity quartz plate. It is needless to say that any plate which is excellent in light transmittance, microwave transmittance and electric conductivity, can be used as the electrode 3. The electrode/sample-holder 4 is made by depositing a metal such as oxygen-free copper or silver on a high purity quartz plate. Referring to FIG. 2, that portion 21 of the deposited metal layer of the holder 4 which is inserted into the resonant cavity 1, has a comb-shaped structure with long, narrow non-deposited areas. Such a comb-shaped structure is very effective for reducing the microwave loss due to the deposited layer. Any plate which is excellent in microwave transmittance and has appropriate electric conductivity, can be used as the electrode/sample-holder 4. The sample 5 is disposed between the electrode 3 and the holder 4, and is fixed to the holder 4 by a mechanism (not shown), and the electrode 3 is fixed by another mechanism (not shown) so that a gap of about 0.1 mm is formed between the electrode 3 and the sample 5. As shown in FIG. 2, the lead wires 13a and 13b are connected to the optically transparent electrode 3 and the electrode/sample-holder 4, respectively, to apply a photo-induced voltage to the lock-in amplifier 12.

Figure 3:
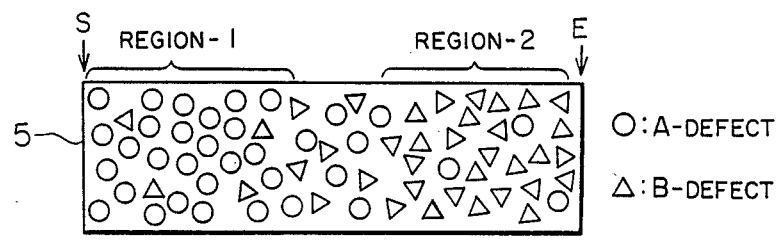
FIG. 3 is a schematic diagram showing a sample and used to explain the principle of the present invention.

Next, the operation principle of the present embodiment will be explained, with reference to FIG. 3.

Now, let us suppose that the sample 5 contains only two kinds of defects, that is, an A-defect denoted by a circle and a B-defect denoted by a triangle, for the sake of simplicity. Further, let us consider a case where each of the A- and B-defects is non-uniformly distributed in the sample 5 as shown in FIG. 3. That is, the density of the A-defect in a region-1 is larger than that in a region-2, and the density of the B-defect in the region-1 is smaller than that in the region-2. When the ESR magnetic field for the A-defect and that for the B-defect are expressed by $H_a$ and $H_b$, respectively, peaks corresponding to the A- and B- defects appear on an ESR spectrum of the sample 5 at the magnetic field intensities $H_a$ and $H_b$. It is to be noted that, in the conventional ESR spectrometer, the above peak is obtained as an average value of signal portions due to all the A- or B-defects in the sample 5. When an ESR spectrum could be obtained at a limited area of the sample 5, the height of each of the above peaks would vary with the limited area, because of the non-uniform distribution of each of the A- and B-defects in the sample 5. That is, the peak which would appear at the resonance magnetic field $H_a$ and corresponds to the A-defect, is higher in the region-1 than in the region-2. While, the peak which would appear at the resonance magnetic field $H_b$ and corresponds to the B-defect, would be higher in the region-2 than in the region-1. Accordingly, the ESR signal in the region-1 would have a spectrum shown in FIG. 4, and the ESR signal in the region-2 would have a spectrum shown in FIG. 5. In a case where the sample 5 is made of a semiconductor material, when the sample 5 is illuminated with light having energy larger than the inter-band transition energy of the semiconductor material, carriers are generated in a light-illuminated portion of the sample. The carriers thus generated recombine at a defect, and the probability of recombination depends upon the spin state of unpaired electron at the defect.

Figure 4:
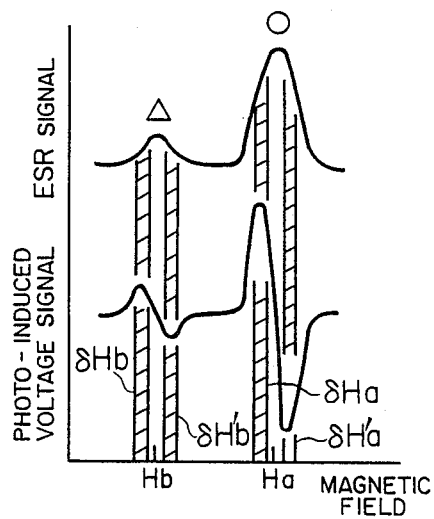
FIG. 4 is a graph showing spectra of an ESR signal and a photo-induced voltage signal with respect to magnetic field, in the region-1 of FIG. 3.
Figure 5:
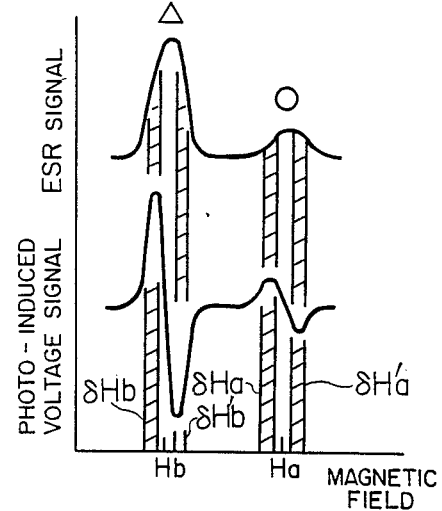
FIG. 5 is a graph showing spectra of an ESR signal and a photo-induced voltage signal with respect to magnetic field, in the region-2 of FIG. 3.
Figure 6:
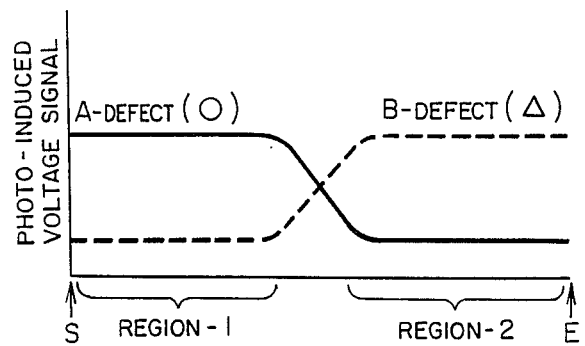
FIG. 6 is a graph showing relations between a position in the sample and photo-induced voltage signals due to A- and B- defects.

Accordingly, the carrier density varies in accordance with whether or not the electron spin resonance occurs at a defect contained in the light-illuminated portion of the sample. Further, a photo-induced voltage depends upon the density of carriers which are generated by illuminating the sample with light. Accordingly, the following operation is performed to detect a change in photo-induced voltage signal. That is, the external magnetic field is scanned by the magnetic field controller 18 to measure the ESR spectrum by the spectrometer 17, thereby detecting a magnetic field range, in which the ESR condition is greatly changed. Then, the external magnetic field is set in the above range, and is modulated within this range by the modulation coil 9, to detect a change in photo-induced voltage. Incidentally, in FIGS. 4 and 5, the above magnetic field range is indicated by a hatched area. As shown in FIGS. 4 and 5, the photo-induced voltage signal has a peak value in the above range. Further, the photo-induced voltage signal is detected by the optically transparent electrode 3 and the electrode/sample-holder 4, and then amplified by the lock-in amplifier 12. In the present embodiment, only the electron spin resonance in a light-illuminated portion of the sample can be detected on the basis of the above-mentioned principle. Further, in the present embodiment, the light beam 6 having a diameter of about 1 $\mu$m can be scanned with respect to the sample 5, by the aid of the rotating mirror 23 for deflecting the light beam 6 so that a resolution of about 0.1 $\mu$m is obtained. FIG. 6 shows photo-induced voltage signals which are obtained by scanning the light beam 6 with respect to the sample 5 of FIG. 3 from a starting point S to an end point E. In FIG. 6, a solid curve indicates a photo-induced voltage signal which is obtained by scanning the sample 5 with the light beam 6 while modulating the external magnetic field within a range $\delta H_a$ of FIGS. 4 and 5, that is, a magnetic field range where ESR signal due to the A-defect becomes maximum. Further, a broken curve in FIG. 6 indicates a photoinduced voltage signal which is obtained by scanning the sample 5 with the light beam 6 while modulating the external magnetic field within a range $\delta H_b$ of FIGS. 4 and 5, that is, a magnetic field range where ESR signal due to the B-defect becomes maximum. As can be seen from the above, the solid curve in FIG. 6 indicates the A-defect distribution along the path of the light beam 6 on the sample 5. While, the broken curve in FIG. 6 indicates the B-defect distribution along the path of the light beam. In the above, the external magnetic field is modulated within the range $\delta H_a$ or $\delta H_b$. However, the external magnetic field may be modulated within a range $\delta H_a'$ or $\delta H_b'$ shown in FIGS. 4 and 5, where ESR signal due to corresponding defects reach their minima. As has been explained in the above, according to the present embodiment, the specified-defect distribution in the sample 5 can be detected with a positional resolution in the order of 1 micron.

In the present embodiment, a cylindrical cavity is used as the resonant cavity 1, and hence the microwave within the resonant cavity 1 has a mode TE$_{011}$. In a case where the sample 5 is placed in a central portion of the resonant cavity 1 filled with the microwave of the above mode, when the light-illuminated position on the sample 5 is shifted in a direction parallel to the axis of the cylinder by a distance equal to one-tenth the height L of the cylinder, the energy density of microwave magnetic field at the light-illuminated position is changed by about 10%. Accordingly, the intensity of detected signal is varied by about 10% for the above shift of the light-illuminated position, notwithstanding the defect density and the light quantity incident on the above position are constant. When the light-illuminated position is shifted by a distance equal to one-thirtieth the height L of the cylinder, the intensity of detected signal is changed by about 1% or less. In a case where such changes in signal intensity cannot be neglected, or it is required to measure the defect distribution in a wider area, it is necessary to correct the detected signal with the energy density of microwave magnetic field. It is needless to say that the above correction is also necessary for a case where the shape of the resonant cavity 1 and the microwave mode in the resonant cavity 1 are different from those in the present embodiment.

Figure 7:
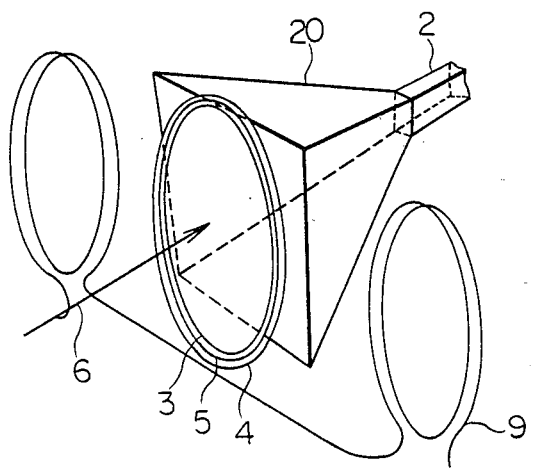
FIG. 7 is a schematic diagram showing a main part of another embodiment of an ESR spectrometer according to the present invention.

Next, explanation will be made of another embodiment of an ESR spectrometer according to the present invention, with reference to FIG. 7. Referring to FIG. 7, a microwave from a microwave supply source (not shown) is supplied to an electromagnetic horn 20 which is disposed between magnetic poles of an electromagnet (not shown), through a waveguide 2, to be sent out to a free space. Further, an optically transparent electrode 3, a sample 4 and an electrode/sample-holder 4 having long, narrow non-deposited areas are disposed at the exit end of the electromagnetic horn 20 in such a manner that the sample 5 is sandwiched between the electrode 3 and the holder 4, and these members 3, 4 and 5 are fixed to the electromagnetic horn 20. A modulation coil 9 for modulating a magnetic field applied to the sample 5 is disposed in the neighborhood of the exit end of the electromagnetic horn 20. The optically transparent electrode 3 and the electrode/sample-holder 4 which are used in the present embodiment, are made of substantially the same material and have substantially the same structure as those shown in FIG. 2. However, the members 3 and 4 used in the present embodiment are different from those shown in FIG. 2, in that the members 3 and 4 of the present embodiment are so large that a sample having a diameter of 10 cm or more such as a semiconductor wafer can be measured. Further, the circuits connected to the members 3, 4 and 9, a method of generating a light beam 6, a method of scanning the light beam 6 with respect to the sample 5, and an adjusting mechanism are the same as used in the embodiment of FIG. 1. However, unlike the embodiment of FIG. 1, the present embodiment cannot measure the amount of microwave absorbed by the sample 5, that is, cannot carry out a usual method for detecting electron spin resonance. However, in a case where the electron spin resonance is detected only by a photo-induced voltage signal, the present embodiment is far superior in workability to the embodiment of FIG. 1, since the sample 5 in the free space is scanned with the light beam 6.

In the present embodiment, the electromagnetic horn 20 is used in place of the resonant cavity 1. Alternatively, a horn-shaped through hole may be formed in the side wall of the resonant cavity 1, to dispose the members 3, 4 and 5 on the outside of the through hole in a manner similar to that shown in FIG. 7, thereby supplying the microwave which escapes from the cavity resonator 1, to the sample 5.

In the embodiments of FIGS. 1 and 7, the defect distribution in the sample 5 has been measured in such a manner that the light beam 6 is scanned with respect to the sample 5 and variations in photo-induced voltage caused by this scanning operation are detected. Alternatively, in the embodiment of FIG. 1, the defect distribution in the sample 5 is measured in such a manner that the light beam 6 is scanned with respect to the sample 5 and variations in level of ESR signal caused by the scanning operation are detected.

As has been explained in the foregoing, in each of the embodiments of FIGS. 1 and 7, it is not required to process a sample for the purpose of measurement, but only electromagnetic waves such as light, a magnetic field and a microwave, are supplied to the sample. Hence, an ESR spectrometer according to the present invention is considered to be means for non-destructive characterization. Further, the present invention has an advantage that a sample is not required to be placed in a vacuum chamber. According to the present invention, it is possible to discriminate between different kinds of defects contained in a sample plate which is made of a semiconductor material, without damaging the sample, and moreover the two-dimensional distribution of a specified defect in the sample can be non-destructively detected with a positional resolution in the order of one micron.

We claim:

1. An electron spin resonance spectrometer comprising:
    magnetic field generating means for applying a magnetic field to a sample;
    microwave supply means for supplying a microwave to the sample;
    illumination means for illuminating the sample with light; and
    photo-induced voltage detecting means for detecting a photo-induced voltage appearing across the sample.

2. An electron spin resoannce spectrometer according to claim 1, wherein the sample is illuminated with a focused light beam.

3. An electron spin resonance spectrometer according to claim 2, further comprising means for scanning the magnetic field applied to the sample, and means for measuring a change in photo-induced voltage caused by the magnetic field scanning.

4. An electron spin resonance spectrometer according to claim 2, further comprising means for scanning the sample with the focused beam, modulation means for modulating the magnetic field, means for extracting that component of the photo-induced voltage which is synchronized with the magnetic field modulation, from the photo-induced voltage, and means for measuring a change in extracted component caused by the scanning operation of the focused light beam.

5. An electron spin resonance spectrometer according to claim 1, wherein the sample is formed of a filmy semiconductor.

6. An electron spin resonance spectrometer according to claim 5, wherein the energy of the light is higher than the inter-band transition energy of the semiconductor.

7. An electron spin resoannce spectrometer according to claim 5, wherein the photo-induced voltage detecting means includes two electrodes for putting the sample therebetween and a lock-in amplifier for amplifying an electric signal taken out by the electrodes, a first one of the electrodes has a structure capable of transmitting the microwave, to apply the transmitted microwave to the sample, and a second one of the electrodes is optical transparent so that the light can impinge on the sample through the second electrode.

8. An electron spin resonance spectrometer according to claim 1, wherein the microwave from the microwave supply means is applied to the sample through an electromagnetic horn.

9. An electron spin resonance spectrometer according to claim 1, further comprising a resonant cavity for containing the sample therein, a waveguide for introducing the microwave from the microwave supply means into the resonant cavity, microwave detection means for detecting the reflected microwave from the resonant cavity, and absorbed-microwave detection means for detecting a reduction in microwave intensity due to the microwave absorption of the sample, from the microwave intensity supplied to the resonant cavity and the microwave intensity reflected from the resonant cavity.

10. An electron spin resonance spectrometer according to claim 9, wherein the light from the outside of the resonant cavity is incident on the sample through a through hole provided in the wall of the resonant cavity, and thin metal wires are provided on the through hole in directions parallel to the direction of a microwave-induced current flowing through the wall of the resonant cavity, at appropriate intervals.

11. An electron spin resonance spectrometer according to claim 9, further comprising means for focusing the light on a point, means for scanning the sample with the focused light, and means for scanning the magnetic field.

12. A electron spin resonance spectrometer comprising:
    magnetic field generating means for applying a magnetic field to a sample;
    microwave supply means for supplying a microwave to the sample;
    illumination means for illuminating the sample with a finely focused light beam;
    a resonant cavity for containing the sample therein;
    a waveguide for introducing the microwave from the microwave supply means into the resonant cavity;
    microwave detection means for detecting the reflected microwave from the resonant cavity; and
    absorbed-microwave detection means for detecting a reduction in microwave intensity due to the microwave absorption of the sample, from the microwave intensity supplied to the resonant cavity and the microwave intensity reflected from the resonant cavity.

13. An electron spin spectrometer according to claim 12, further comprising scanning means for scanning the finely focused light beam with respect to the sample, and means for measuring variations of microwave absorption of the sample caused by scanning the sample with the finely focused light beam.

14. An electron spin resonance spectrometer according to claim 13, wherein said sample is formed of a filmy semiconductor.

15. An electron spin resonance spectrometer according to claim 14, wherein the energy of the light is higher than the inter-band transition energy of the semiconductor.

16. An electron spin resonance spectrometer comprising:
    magnetic field generating means for applying a magnetic field to a sample;
    microwave supply means for supplying a microwave to the sample;

illumination means for illuminating the sample with light;

a resonance cavity for containing the sample therein;

a waveguide for introducing the microwave from the microwave supply means into the resonant cavity;

microwave detection means for detecting the reflected microwave from the resonant cavity; and absorbed-microwave detection means for detecting a reduction in microwave intensity due to the microwave absorption of the sample, from the microwave intensity supplied to the resonant cavity and the microwave intensity reflected from the resonant cavity;

wherein said sample is formed of a filmy semiconductor, wherein the spectrometer further comprises photo-induced voltage appearing across the sample, and wherein the photo-induced voltage detecting means includes two electrodes for putting the sample therebetween and a lock-in amplifier for amplifying an electric signal taken out by the electrodes, a first one of the electrodes has a structure capable of transmitting the microwave, to apply the transmitted microwave to the sample, and a second one of the electrodes is optically transparent so that the light can impinge on the sample through the second electrode.

17. An electron spin resonance spectrometer comprising:

magnetic field generating means for applying a magnetic field to a sample;

microwave supply means for supplying a microwave to the sample;

illumination means for illuminating the sample with light;

a resonant cavity for containing the sample therein;

a waveguide for introducing the microwave from the microwave supply means into the resonant cavity;

microwave detection means for detecting the reflected microwave from the resonant cavity; and absorbed-microwave detection means for detecting a reduction in microwave intensity due to the microwave absorption of the sample, from the microwave intensity supplied to the resonant cavity and the microwave intensity reflected from the resonant cavity;

wherein said illumination means illuminates said sample with an illumination light having a diameter of about 1 $\mu$m, wherein positional resolution in measurements to the order of 1 $\mu$m are enabled.

18. An electron spin resonance spectrometer comprising:

magnetic field generating means for applying a magnetic field to a sample;

microwave supply means for supplying a microwave to the sample;

illumination means for illuminating the sample with a finely focused light beam;

light detecting means for scanning the sample surface with the finely focused light beam;

a resonant cavity for containing the sample therein;

a waveguide for introducing the microwave from the microwave supply means into the resonant cavity;

microwave detection means for detecting the reflected microwave from the resonant cavity;

absorbed-microwave detection means for detecting absorption of the sample, from the microwave intensity supplied to the resonant cavity and the microwave intensity reflected from the resonant cavity; and means for measuring variations of the microwave absorption of the sample caused by scanning the sample with the finely focused light beam.

19. An electron spin resonance spectrometer according to claim 18, wherein said illumination means illuminates said sample with said finely focused light beam having a diameter of about 1 $\mu$m, wherein positional resolution in measurements to the order of 1 $\mu$m are enabled.

* * * * *